United States Patent
Chen et al.

(10) Patent No.: US 9,187,823 B2
(45) Date of Patent: Nov. 17, 2015

(54) HIGH ELECTRIC FIELD FABRICATION OF ORIENTED NANOSTRUCTURES

(75) Inventors: Junhong Chen, Kenosha, WI (US); Kehan Yu, Milwaukee, WI (US); Zheng Bo, Zhejiang Province (CN); Guahua Lu, Milwaukee, WI (US)

(73) Assignee: National Science Foundation, Arlington, VA (US)

( * ) Notice: Subject to any disclaimer, the term of this patent is extended or adjusted under 35 U.S.C. 154(b) by 490 days.

(21) Appl. No.: 13/607,220

(22) Filed: Sep. 7, 2012

(65) Prior Publication Data

US 2015/0240351 A1     Aug. 27, 2015

Related U.S. Application Data

(60) Provisional application No. 61/531,747, filed on Sep. 7, 2011.

(51) Int. Cl.

| | |
|---|---|
| H01L 21/20 | (2006.01) |
| H01L 21/36 | (2006.01) |
| C23C 16/26 | (2006.01) |
| H01J 27/02 | (2006.01) |
| C23C 16/44 | (2006.01) |
| C23C 16/50 | (2006.01) |

(52) U.S. Cl.
CPC ............. *C23C 16/26* (2013.01); *C23C 16/44* (2013.01); *C23C 16/50* (2013.01); *H01J 27/022* (2013.01)

(58) Field of Classification Search
USPC .......................................... 438/478
See application file for complete search history.

(56) References Cited

U.S. PATENT DOCUMENTS

| | | | |
|---|---|---|---|
| 7,504,628 B2 | 3/2009 | Chen | |
| 7,601,205 B2 * | 10/2009 | Furukawa et al. | 96/69 |
| 8,240,190 B2 | 8/2012 | Chen et al. | |
| 8,268,405 B2 | 9/2012 | Chen et al. | |
| 2001/0024633 A1 * | 9/2001 | Lee et al. | 423/447.3 |
| 2007/0184190 A1 * | 8/2007 | Hiramatsu et al. | 427/249.1 |
| 2008/0138374 A1 * | 6/2008 | Storey et al. | 424/423 |
| 2009/0088040 A1 * | 4/2009 | Nishimura et al. | 445/51 |

* cited by examiner

*Primary Examiner* — Asok K Sarkar
(74) *Attorney, Agent, or Firm* — Boyle Fredrickson, S.C.

(57) ABSTRACT

A method of growing carbon nanostructures on a conductive substrate without the need for a vacuum or low-pressure environment provides high electrical field strengths to generate the necessary carbon ions from a feedstock gas and to promote alignment and separation of the resulting structures. In one embodiment, substantially uniform "vertical" nanostructures may be formed around the periphery of an extended wire for use in corona discharge applications or the like. Growth on a planar substrate may provide use with a variety of apparatus requiring a high specific surface conductor such as capacitors, batteries, and solar cells.

15 Claims, 3 Drawing Sheets

HIGH ELECTRIC FIELD FABRICATION OF ORIENTED NANOSTRUCTURES

CROSS REFERENCE TO RELATED APPLICATION

This application claims the benefit of U.S. provisional application 61/531,747 filed Sep. 7, 2011, hereby incorporated by reference.

STATEMENT REGARDING FEDERALLY SPONSORED RESEARCH OR DEVELOPMENT

This invention was made with government support under 0900509 and 0856753 awarded by the National Science Foundation. The government has certain rights in the invention.

BACKGROUND OF THE INVENTION

The present invention relates to the fabrication of carbon nanostructures such as carbon nanowalls and few-layer graphene and, in particular, to an improved process capable of operating at substantially atmospheric pressure and providing oriented nanostructures.

Nanostructures such as carbon nanowalls (CNW) present substantially two-dimensional graphitic platelets of few-layer graphene. It is believed that CNWs may exhibit similar properties to graphene including extremely high ballistic electron mobility, high thermal conductivity, high Young's modulus, and high fracture strength. The large surface area of CNWs holds promise in the fabrication of electrodes for electrical energy storage (e.g. batteries and capacitors), electrodes for solar cells, sensors, and substrates for catalysts. The sharp edges of CNWs may make them useful field emission materials or for generating corona discharge.

Ideally CNWs would be fabricated or arrayed in "vertical" orientation meaning that the substantially planar CNW flakes are extended edgewise perpendicularly from a surface of a substrate to which they are both electrically and mechanically attached.

Current methods of manufacturing CNWs may use a microwave plasma-enhanced chemical vapor deposition (MPECVD) or high current DC plasma enhanced chemical vapor deposition (PECVD) operating in a near vacuum or low-pressure environment (0.1-1330 Pa). The low-pressure environment ensures an adequate mean free path of the electrons promoting sufficiently energetic electrons as is necessary for decomposition of the carbon precursors (such as hydrocarbon gases) providing the feedstock for the CNWs.

SUMMARY OF THE INVENTION

The present inventors have developed a process for generating CNWs in a high field environment allowing controllable deposition of vertically oriented CNWs at relatively high atmospheric pressures. The inventors have determined that high electric field strengths overcome the substantial reduction in mean free electron paths (2 to 3 orders of magnitude) attendant to processing at atmospheric pressures. The high field strengths are further believed to favorably impact the orientation and separation of the CNWs and allow selective deposition of the CNWs by manipulating the field lines in the proximity of a selectively conductive substrate.

Specifically, one embodiment of the invention may provide a method of growing oriented nanostructures by providing a conductive substrate for receiving the nanostructures and introducing a carbon feedstock gas to flow at substantially atmospheric pressure in a space proximate to the conductive substrate. An electrical field is imposed between the conductive substrate and at least one proximate electrode to break down the carbon feedstock gas for reconstitution as carbon nanostructures on the substrate.

It is thus a feature of at least one embodiment of the invention to provide a practical fabrication process for carbon nanostructures operating at or near atmospheric pressures thereby avoiding the costs and complexity of low pressure or vacuum fabrication equipment.

The electrical field may be in excess of 100 volts per millimeter.

It is thus a feature of at least one embodiment of the invention to provide electrical field strengths that both overcome a reduction of electron mean free path at high pressures and that promote vertical growth of the nanostructures.

The electrode structures have substantially different facing areas to present an asymmetric electrical field.

It is thus a feature of at least one embodiment of the invention to promote high field strengths through geometric means moderating the need for high electrical voltages.

The method may include the step of preheating the carbon feedstock gas.

It is thus a feature of at least one embodiment of the invention to employ thermal energy in the heating of the precursor gas to augment the electron energy in breaking down of the precursor gas.

The method may further include the step of introducing oxygen radicals to the carbon feedstock gas.

It is thus a feature of at least one embodiment of the invention to promote the formation of nanostructures rather than amorphous carbon.

The method may include the step of thermally annealing the substrate in a reducing environment after formation of the carbon nano structures.

It is thus a feature of at least one embodiment of the invention to provide a method of removing oxygen functional groups from the resulting nanostructures.

The proximate electrode, in one embodiment, may be a sharpened and conductive tip facing the conductive substrate and the conductive substrate may be a substantially planar surface.

It is thus a feature of at least one embodiment of the invention to provide extremely high electrical field strengths near the proximate electrode to produce highly energetic electrons at practical voltages.

Alternatively, the proximate electrode may be an array of sharp and conductive tips.

It is thus a feature of at least one embodiment of the invention to provide high electron rates with the benefits of the sharpened tip electrode.

Alternatively, the proximate electrode may be a substantially planar surface and the conductive substrate may be an elongated wire.

It is thus a feature of at least one embodiment of the invention to promote the distribution of electrical field lines terminating radially on a wire so as to promote a circumferentially uniform, radially extending deposition of carbon nanostructures useful for a corona discharge electrode or the like.

The substrate may be substantially free from catalytic materials.

It is thus a feature of at least one embodiment of the invention to provide a method of fabricating nanostructures that does not require laborious or difficult preparation of the substrate with catalytic materials.

Alternatively, the substrate may be provided with electrically attached carbon nanotubes and the carbon nanostructures are carbon nanowalls growing from the carbon nanotubes. In this regard, the invention may also provide a novel material comprised of carbon nanotubes having first ends attached to a conductive substrate and second ends bonded to at least one carbon nanowall by carbon sp2 bonds to be intrinsically fused thereto.

It is thus a feature of at least one embodiment of the invention to provide a composite nanostructure advantageously combining the strengths of carbon nanotubes and carbon nanowalls and without the "loose" (high electrical impedance) junctions characteristic of existing methods.

The method may use a substrate having first and second conductive regions spatially separated from each other and adapted to permit mutual electrical isolation of the first and second conductive regions after processing.

It is thus a feature of at least one embodiment of the invention to permit the patterned growth of carbon nanostructures by manipulating the electrical field lines at the substrate by selective electrical connection or isolation of different substrate regions.

The invention may provide a corona discharge electrode having a conductive wire adapted to be exposed to air and to receive an electrical voltage and with a plurality of carbon nanowalls attached to and in electrical communication with the conductive wire each comprising few layers of graphene and oriented edgewise to extend perpendicularly to a surface of the conductive wire at a point of attachment. The nanostructures may have a side attached to the conductive support and be arranged to provide electrodes extending into surrounding air and having radii less than 100 nm to ionize the air at the nanowalls with the electrical voltage.

It is thus a feature of at least one embodiment of the invention to provide an improved corona discharge electrode.

These particular objects and advantages may apply to only some embodiments falling within the claims and thus do not define the scope of the invention.

BRIEF DESCRIPTION OF THE FIGURES

FIG. 8 is a figure similar to that of FIG. 6 showing the structure of FIG. 6 with a closer proximity of the fingers to permit bridging nanostructures to grow therebetween for the production of an FET structure for gas sensing or the like.

DETAILED DESCRIPTION OF THE PREFERRED EMBODIMENT

Figure 1:
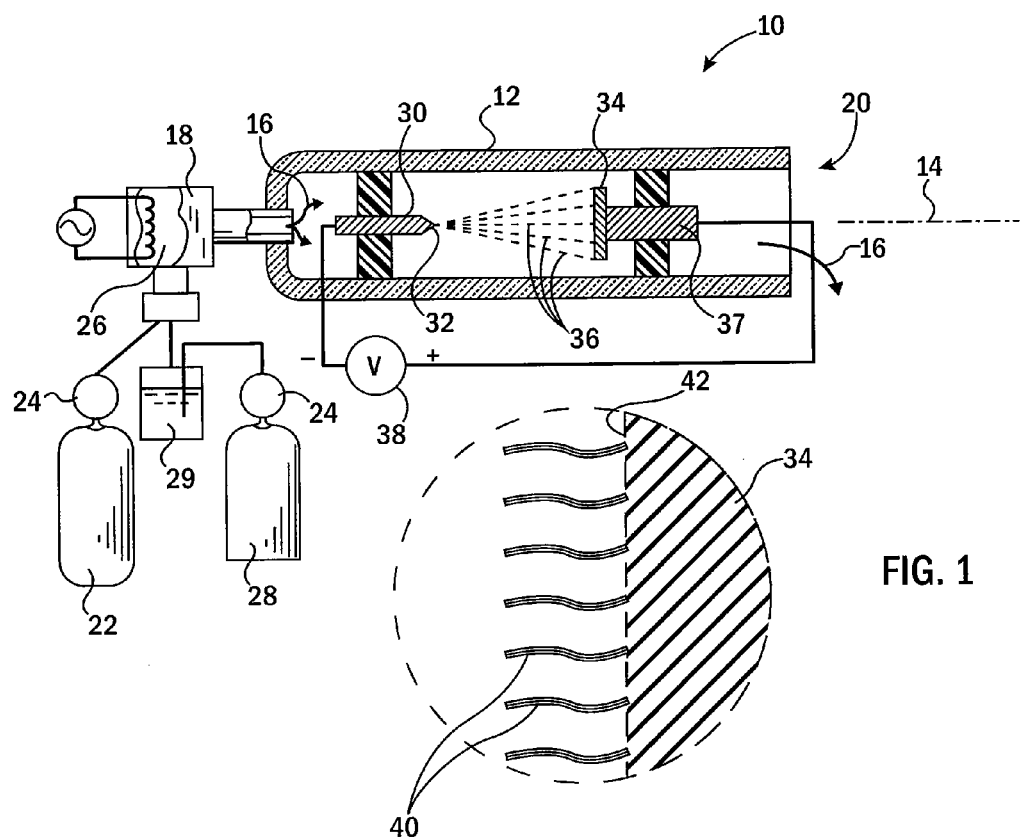
FIG. 1 is a simplified elevational cross-section of a reaction chamber for generating the nanostructures of the present invention showing a substrate electrode in opposition to a proximate electrode, the reaction chamber for receiving carbon precursors to the nanostructures in the area of the electrodes, and an enlarged detail of the substrate depicting resulting vertically aligned carbon nanowalls.

Referring now to FIG. 1, a reaction chamber 10 suitable for use with the present invention may provide for an outer chamber housing, for example an elongate tube 12 extending along an axis 14. One end of the tube 12 may receive a gas mixture 16 from a heater 18, the latter preheating the gas mixture 16 to a desired temperature, for example 700-1000 degrees C. Heated gas mixture 16 may flow along the axis 14 through the tube 12 and out end 20 opening to the atmosphere so that the pressure within the tube 12 is close to atmospheric pressure. More generally, the pressure within the tube 12 will be above 0.1 Pascal and more specifically above 1330 Pascal the former constituting substantial vacuum and the latter low-pressure processing similar to that done in the prior art.

The heater 18 receives the gas mixture 19 from a mixing chamber 26 which may receive a carrier gas 22, such as argon, controlled in flow and pressure by mass flow control regulator 24, to be mixed in a mixing chamber 26 with a precursor gas 28, for example, methane or $CH_4$, the precursor gas 28 providing a source of carbon for generation of carbon nanostructures. The precursor gas 28 may be bubbled through purified de-ionized water 29 to raise its relative humidity and to provide a source of water vapor that will be used to provide a source of oxygen radicals to be described below. In one embodiment, ethanol may be used in lieu of the de-ionized water.

The gas mixture 16 received from the heater 18 may pass a needle electrode 30 (discharge electrode) within the reaction chamber, the needle electrode 30 having a sharpened tip 32 aimed downstream with respect to the gas flow. Sharpened tip 32 may face a planar substrate 34 (passive electrode) displaced at a separation distance further downstream in the tube 12 and presenting a conductive surface substantially perpendicular to axis 14. The planar substrate 34 may, for example, be a silicon wafer, or a panel of stainless steel, copper or other conductive material. The substrate 34 may be attached to a conductive support 37, for example graphite, which in turn is connected to a positive terminal of a DC power source 38. The negative terminal of the DC power source 38 may be attached to the needle electrode 30 to provide a voltage difference therebetween.

The voltage difference and geometric configurations of the needle electrode 30 and substrate 34 are such as to create an electrical field averaging in excess of 100 volts per millimeter between the needle electrode 30 and the substrate. In one example, the separation between the needle electrode sharpened tip 32 and substrate 34 may be 10 millimeters and the DC power source 38 may have a voltage of 3.3 kilovolts.

Although the inventor does not wish to be bound by a particular theory, it is understood that the electrons ejected from the sharpened tip 32 collide with the precursor gas 28 to create a charged plasma of carbon that is directed along electrical field lines 36 evenly over the substrate 34, the carbon moving along the electrical field lines 36 to form into nanostructures 40 generally aligned with the electrical lines and perpendicular to a surface 42 of the substrate 34 facing the sharpened tip 32. Generally the nanostructures 40 may be carbon nanowalls consisting of few-layer graphitic nanosheets with a thickness of several to tens of nanometers and, for example, from 1 to 5 layers of graphene. The orientation of the nanostructures 40 is "vertical" meaning generally perpendicular to the surface 42 to present an outward sharp edge having an effective radius of less than 100 nanometers.

EXAMPLE I

CNWs were synthesized by a DC PECVD system. A conical profile tungsten pin (taper: approximately 1:5, tip radius: approximately 0.01 mm) was connected to a negative direct current high voltage (DCHV, 0 to approximately 10 kV adjustable, 4000 Series, EMCO High Voltage Corporation) and used as the discharge electrode (cathode). A grounded, mirror-polished stainless steel plate was used as the passive electrode (anode), as well as the growth substrate. The interelectrode gap d was fixed at 5 mm or 10 mm in the current work. Prior to the growth, the substrate was brought to 700 degrees C. and held at that temperature for 10 min in an Ar/H2 flow (1% H2 by volume) of 1000 standard cubic centimeters per minute (sccm). $CH_4$ (0.15 sccm, carbon source) was mixed with Ar (1.35 sccm) and bubbled through a deionized water (source of hydroxyl radicals) bath as the feed gases. The temperature of the water bath was controlled and adjusted by a heating thermostat (model: RE108 with control head E 100; Lauda Ecoline) to vary the feed gas moisture content. An electronic hygrometer (repeatability: ±0.3%; model: Humi-Chek 5; Beckman Industrial) was used to monitor the relative humidity (RH) of feed gases. All flow rates were controlled by mass flow controllers (MFCs). Throughout the process, the reactor pressure was maintained at one atmosphere (101,325 Pa). The discharge duration (i.e., growth time) t varied from 30 s to 10 min. A Keithley 2000 multimeter was used to measure the discharge current I. The inter-electrode voltage drop $U_e$ was measured by the internal voltage monitor of DCHV.

A range of voltages $U_e$ were investigated between 2.4 and 3.4 kilovolts at a range of relative humidity between 18.9 percent and 62.1 percent with 38.8 percent being considered as providing the best morphology of the carbon nanowalls. The results of this process are described in the paper "Understanding growth of carbon nanowalls at atmospheric pressure using normal glow discharge plasma-enhanced chemical vapor deposition" by Zheng Bo, Kehan Yu, Ganhua Lu, Pengxiang Wang, Shun Mao, Junhong Chen, CARBON 49 (2011) 1849-1858, hereby incorporated by reference.

EXAMPLE II

A plasma reactor consisting of a quartz tube housing a tungsten needle cathode was used with a grounded graphite rod anode and a dc high negative voltage supply (EMCO 4100N; up to −10 kV) to drive the dc glow discharge. Argon was used as the plasma gas. A tube furnace (TF55035 A-1, Lindberg/BLUE M, Asheville, USA) was used to heat the reactor. Silicon wafers, stainless steel plates, and Cu plates were used as substrates. The substrates were mounted on the top of the graphite rod; no metals were added as potential catalysts. Prior to the growth, the substrate was brought to 700° C. and held at that temperature for 10 min in an Ar/H2 flow (1% $H_2$ by volume) of 500 standard cubic centimeters per minute (sccm). The two electrodes were separated by a distance of 1.0 cm. Then the Ar/H2 flow was switched to an Ar/ethanol flow (1,000 sccm) through an ethanol bubbler. The dc glow discharge was ignited at a dc voltage of 3.3 kV. Once the dc plasma was formed, the voltage between the electrodes immediately dropped to 2.2 kV, and the current was about 1.3 mA, yielding a total plasma power of 2.9 W. The plasma was typically left on for 15 min. Then, the plasma was turned off and the system was cooled down to room temperature with a flow of Ar/H2 only. Throughout the process, the reactor pressure was maintained at one atmosphere. The reactor temperature was measured as close to 700° C. (the preset furnace temperature) using a thermocouple. This suggests that the energy dissipated in the DC glow discharge was non-thermal (electrons were preferentially heated by the plasma) and heavy species (e.g., gas molecules, atoms, radicals, and ions) were not substantially heated by the plasma. After the plasma was turned off, a layer of black, powder-like material could be seen on the substrate. In order to reduce oxygen functional groups decorated on the as-grown CNWs, the CNWs were thermally annealed at 900° C. in H2 flow (1,000 sccm) for 2 h at atmospheric pressure.

An area of CNWs covering approximately 1 square centimeter were obtained with dimensions ranging from about 200 by 200 nanometers squared to one by one micrometers squared which could be controlled by the growth time. The thickness of the CNWs is typically below 10 nanometers. Each of the CNW clusters had a "flower-like" shape projecting upward in different directions. These results are described in the paper: Growth of carbon nanowalls at atmospheric pressure for one-step gas sensor fabrication by Kehan Yu, Zheng Bo, Ganhua Lu, Shun Mao, Shumao Cui, Yanwu Zhu, Xinqi Chen, Rodney S Ruoff, Junhong Chen in Nanoscale Research Letters 2011, 6:202, hereby incorporated by reference.

Figure 2:
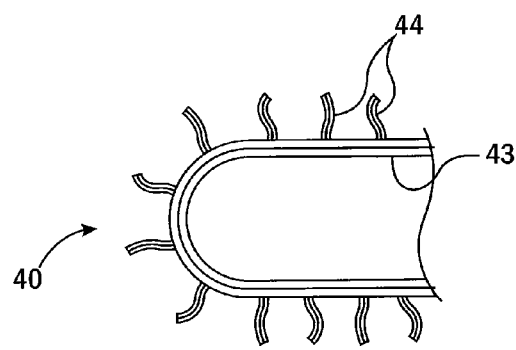
FIG. 2 is an enlarged fragmentary cross-section of a carbon nanotube when used as a substrate of FIG. 1 having carbon nanowalls attached on its outer surface.

Referring now to FIGS. 1 and 2, the substrate 34 may be pre-populated with single or multi-wall carbon nanotubes 43 arranged vertically and/or randomly on the substrate 34 as grown in place or attached thereto. Few-layer graphene sheets 44 may then be grown on the carbon nanotube 43 using the above-described equipment. These graphene sheets 44 are intrinsically connected to the underlying carbon nanotubes 43 without deliberate introduction of catalysts to chemically bond to the carbon nanotubes 43 by $sp^2$ carbons to form a single total carbon nanostructure with minimized interfacial resistance. The lateral dimension of the graphene sheets 44 ranges from 200 to 500 nanometers.

EXAMPLE III

Three types of multiwall carbon nanotubes (MWCNTs) were used: homegrown CNTs, commercial CNTs, and vertically aligned CNT arrays. We used a 100-tube furnace (Lindberg Blue, TF55035A-1) to synthesize CNTs through chemical vapor deposition (CVD). Briefly, thin films of Al (0.5 nm) and Fe (0.8 nm) were sequentially deposited onto an Si wafer as a diffusion barrier and a catalyst layer, respectively. $C_2H_2$ (0.05 lpm; bubbled through deionized (DI) water) and H2 (0.5 lpm) served as carbon feedstock and carrier gas, respectively. The synthesis took place at 700 degrees C. and under atmospheric pressure. As-grown CNTs were approximately 10 nm in diameter and 300 μm in length. The commercial CNT powders were purchased from Alfa Aesar (20 nm O.D., 5-20 μm long). Vertically aligned CNTs (Nanolab Inc., diameter=150 nm, length=10 μm, site density=$2\times10^6$ tubes/$cm^2$) were grown on a silicon wafer with nickel catalysts by PECVD. The intertube spacing was about 10 μm. To form planar CNT networks, either the home-grown CNTs or commercial CNTs were first dispersed in ethanol by ultrasonication. Then, the CNT suspensions were drop-cast onto Cu TEM grids covered with lacey carbon film (Ted Pella) or Si wafers. CNTs were left on grids or wafers after ethanol evaporation.

Synthesis of CNT-FLG Structures by PECVD

CNT-FLG structures were produced using PECVD. The plasma reactor consisted of a 100 quartz tube that housed a tungsten needle cathode, a grounded graphite rod anode, and a direct current (DC) negative voltage supply (EMCO 4100N; up to approximately 10 kV) to drive the dc plasma. Argon was used as the plasma gas. A tube furnace was used to heat up the reactor. The target samples (CNTs suspended on TEM grids, CNT thin films on quartz slides/Si wafers, or vertically aligned CNTs on Si wafers) were mounted on the top of the graphite rod. Prior to the growth, the reactor was heated to 700 degrees C. and held at that temperature for 10 min in an Ar flow. The two electrodes were separated by a distance of 1.0 cm. Then a $CH_4$ flow through a water bubbler was introduced into the reactor. Meanwhile, a DC plasma was initiated at a bias of 3.5 kV. The discharge current between the anode and the cathode was about 0.8 mA. Specifically, the Ar and $CH_4$ flow rates were 0.5 lpm and 0.5 lpm for CNT/TEM grid targets, and 1.0 lpm and 0.1 lpm for other targets. The growth period for TCEs was 2 min. At the end of the synthesis, the plasma was turned off while the system was cooled down to room temperature with a pure H2 flow (1.0 lpm). Throughout the process, the reactor pressure was maintained at 1 atm.

Fabrication of TCEs

A vacuum filtration technique was adapted to make TCE films. Commercial MWCNTs were ultrasonically dispersed in deionized (DI) water with assistance of surfactants (Alfa Aesar). Filter membranes made of 0.025 μm mixed cellulose ester (MCE, Millipore) were employed in a vacuum filtration apparatus. The solution was filtered down, and CNTs were caught on the membrane. Residual surfactant left in the film was subsequently washed away using purified water. The membrane with CNTs wetted with water was pressed against a quartz slide and then dried in an oven at 90 degrees C. for 1 h. The MCE membrane was removed by an acetone vapor bath and reflux condensation. The substrate/CNT/membrane assembly rested on a water-cooled condenser near the top of the container where distilled, condensing acetone continually washed the nanotube film. Product CNT TCEs were annealed in Ar flow (1 lpm) at 700 degrees C. for 1 h.

Transparent conductive electrode (TCE) films of CNT-FLG structures were obtained by PECVD processing of CNT films. Pure graphene suspension (PureSheets, research grade, NanoIntegris) with 3 wt % was added into the CNT suspension to fabricate the random CNT-graphene TCE film following the same procedure.

The resulting CNT-FLG structures are described in Carbon Nanotube with Chemically Bonded Graphene Leaves for Electronic and Optoelectronic Applications by Kehan Yu, Ganhua Lu, Zheng Bo, Shun Mao, and Junhong Chen, J. Phys. Chem. Lett. 2011, 2, 1556-1562, hereby incorporated by reference.

Generally, the unified CNT-FLG structure significantly improves the electrical conductivity of TCEs without degrading the transparency that may occur through bridging loose tube-tube junctions.

Figure 3:
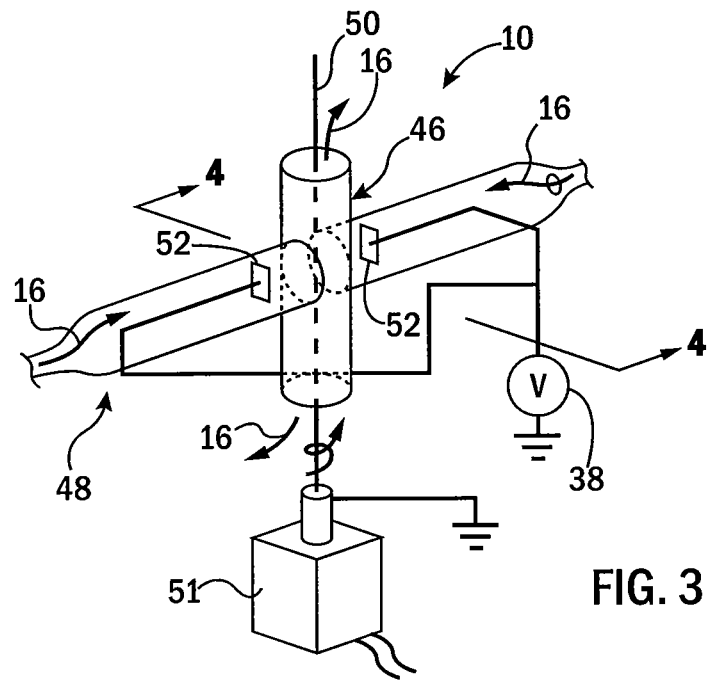
FIG. 3 is a perspective phantom view of an alternative reaction vessel for applying carbon nanowalls in vertical orientation to a wire substrate, for example, for corona discharge applications.
Figure 4:
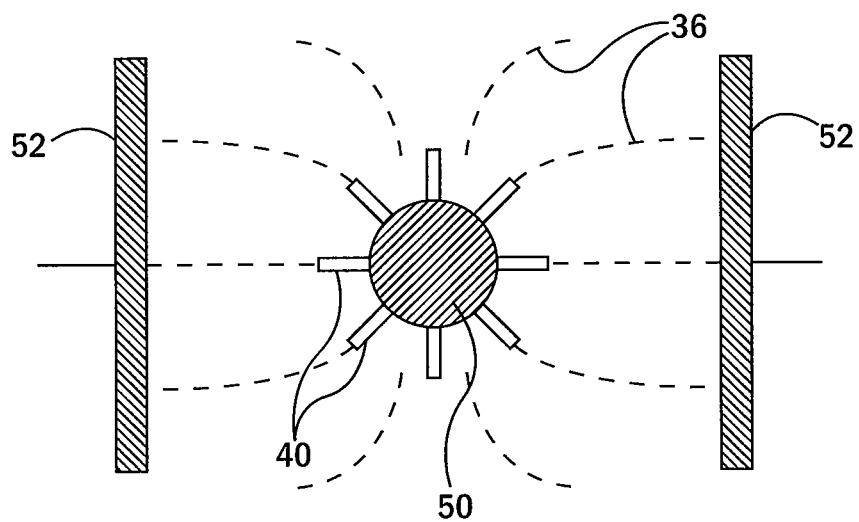
FIG. 4 is a simplified cross section taken along line 4-4 of FIG. 3 of the reaction vessel of FIG. 3 showing the uniform growth of carbon nanowalls on the wire in locally vertical orientation.

Referring now to FIGS. 3 and 4, the reaction chamber 10, in an alternative embodiment, may be constructed of a four-way cross-tube having a vertical tube 46 intersecting a horizontal tube 48. The outer surfaces of the tube may be insulated to retain heat therein. The vertical tube 46 may be open at its upper and lower ends to receive a wire 50 (e.g. stainless steel 0.127 millimeters in diameter) providing the conductive substrate 34. The wire 50 is axially aligned with the vertical tube 46 and attached to a motor drive 51 that may rotate the wire 50 about its axis (e.g. ⅔ RPM) and move it in translation along the axis (0.2 millimeters/seconds). During such combined movement, the wire 50 may be electrically grounded with respect to power source 38. The outer arms of the horizontal tube 48 may each receive gas mixture 16 from the heater 18 (not shown) to flow toward an intersection of the tubes 46 and 48 and then to be diverted upward and downward out of tube 46. Planar discharge electrodes 52 attached to the negative terminal of the power supply present opposed planar surfaces flanking the wire 50 to provide electrical field lines 36 converging on the wire 50 to intersect the same in a direction substantially perpendicular to a surface of the wire 50 at those points of intersection. In operation, nanostructures 40 may be grown extending vertically (e.g., outward) from the wire 50 over a length of wire 50 as moved by motor drive 51 to provide for an elongate corona discharge electrode, for example, similar in function to the type described in U.S. Pat. No. 7,504,628 by the present inventor and hereby incorporated by reference.

Analysis of the carbon nanowall elements forming the nanostructures 40 indicate that they are strongly connected to the stainless steel wire surface via a carbon layer and exhibited improved corona discharge properties providing a substantial reduction in necessary voltage needed to initiate substantial discharge current over a bare stainless steel wire. The electrode is described in more detail in the paper: "Vertically oriented graphene sheets grown on metallic wires for greener corona discharges: lower power consumption and minimized ozone emission" by Zheng Bo, Kehan Yu, Ganhua Lu, Shumao Cui, Shun Mao and Junhong Chen, Energy Environ. Sci., 2011, 4, 2525-2528, hereby incorporated by reference.

Figure 5:
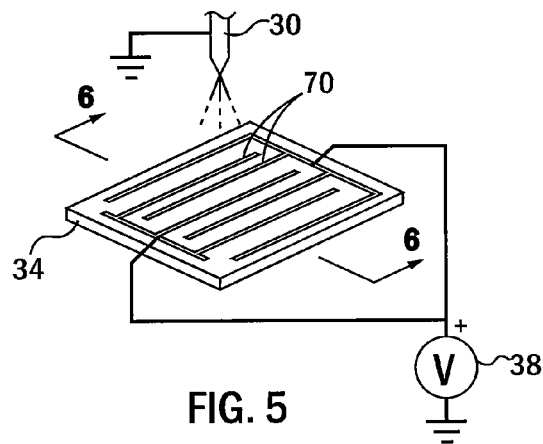
FIG. 5 is a simplified perspective view of an alternative substrate having spatially isolated interdigitated conductive fingers for selective growth of nanostructures on the fingers using the present invention.
Figure 6:
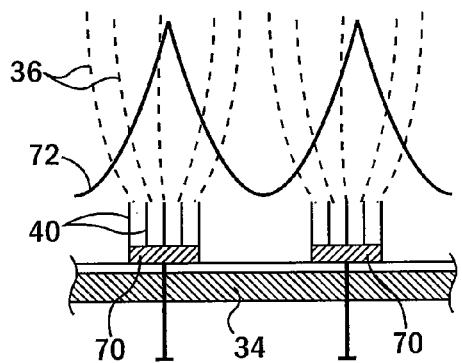
FIG. 6 is a fragmentary cross-section taken along line 6-6 of FIG. 5 showing electrical field strength variations that concentrate nanostructure growth on the fingers.

Referring now to FIGS. 5 and 6, in one embodiment, the substrate 34 may be patterned with a conductive electrode material forming interdigitated fingers 70 or the like. In one example, the fingers 70 may be gold electrodes spaced from each other and having a thickness of 50 nanometers as fabricated using E-beam lithography or the like on a silicon wafer with a top insulating layer of thermally formed silicon dioxide of about 200 nanometers. During fabrication, each of these fingers 70 may be connected to the negative terminal of power source 38 but the fingers may be electrically separated during use. The electrical field strength 72 in the vicinity of the fingers 70 will rise abruptly preferentially depositing nanostructures 40 on the fingers and not on the remaining insulated and/or isolated portions of the substrate 34. This allows controlled deposition of nanostructures 40 on the substrate 34.

Figure 8:
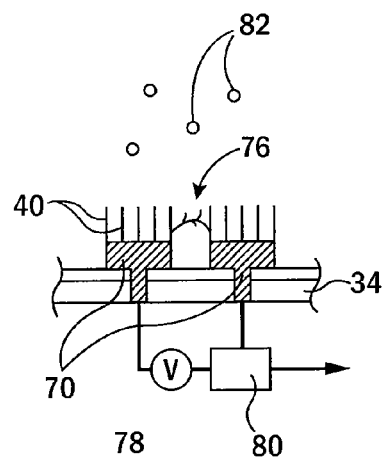

Referring momentarily to FIG. 8, by placing the fingers 70 close together, for example, with the spacing of one micrometer, a carbon nanowall film 76 may be encouraged to grow between the fingers 70 over the substrate 34. By connecting two adjacent electrically separable fingers 70 to voltage source 78 and measuring the current through an ammeter 80, a sensor may be constructed operating according to the principle of a field effect transistor. For example, introduction of a gas such as nitrogen dioxide 82 ($NO_2$) will increase the conductance between fingers 70 while introduction of a gas such as ammonia ($NH_3$) will cause the conduction to drop. In this case, the nitrogen dioxide is a strong oxidizer with electron-withdrawing power whereas the ammonia donates electrons. This sensor is described in detail in the paper: "Growth of carbon nanowalls at atmospheric pressure for one-step gas sensor fabrication", cited above.

Figure 7:
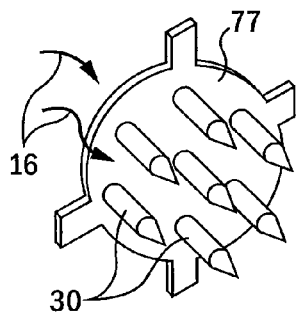
FIG. 7 is a perspective view of an alternative electrode structure for higher carbon nanostructure production throughput.

Referring now to FIG. 7, it will be appreciated that the discharge electrode may comprise multiple parallel-directed needle electrodes 30, for example, held in a supporting insulating matrix 77 and each connected to the power source in parallel to allow for higher throughputs in the deposition of the nanostructures 40.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A method of growing oriented nanostructures comprising the steps of:
   (a) providing a conductive substrate for receiving the nanostructures;
   (b) introducing a carbon feedstock gas to flow at substantially atmospheric pressure in a space proximate to the conductive substrate; and
   (c) imposing a substantially DC electrical field between the conductive substrate and at least one proximate electrode at substantially atmospheric pressure to break down the carbon feedstock gas and to orient carbon of the carbon feedstock gas for reconstitution as carbon nanostructures on the substrate.

2. The method of claim 1 wherein the electrical field is in excess of 100 volts per millimeter.

3. The method of claim 2 wherein structures of the electrodes have substantially different facing areas to present an asymmetric electrical field.

4. The method of claim 3 including the step of preheating the carbon feedstock gas.

5. The method of claim 1 further including the step of introducing oxygen radicals to the carbon feedstock gas.

6. The method of claim 5 wherein the oxygen radicals are OH radicals derived from water vapor.

7. The method of claim 5 further including the step of thermally annealing the substrate in a reducing environment after formation of the carbon nanostructures.

8. The method of claim 1 wherein the carbon nanostructures are carbon nanowalls.

9. The method of claim 1 wherein the proximate electrode is at least one sharpened and conductive tip facing the conductive substrate and the conductive substrate is a substantially planar surface.

10. The method of claim 9 wherein the proximate electrode is an array of sharp and conductive tips.

11. The method of claim 1 wherein the proximate electrode is a substantially planar surface and the conductive substrate is an elongated wire.

12. The method of claim 1 wherein the substrate is provided free from catalytic materials.

13. The method of claim 1 wherein the substrate is provided with electrically attached carbon nanotubes and the carbon nanostructures are carbon nanowalls growing from the carbon nanotubes.

14. The method of claim 1 wherein the substrate includes at least a first and second conductive region spatially separated from each other and adapted to permit mutual electrical isolation of the first and second conductive regions after step (c).

15. An array of carbon nanostructures comprising carbon nanotubes having first ends attached to a conductive substrate and extending outward therefrom and second ends bonded to at least one carbon nanowall by carbon sp2 bonds to be intrinsically fused thereto, the at least one carbon nanowall extending outward from the second ends and removed from the conductive substrate.

\* \* \* \* \*